United States Patent [19]

Young

[11] Patent Number: 4,864,240

[45] Date of Patent: Sep. 5, 1989

[54] MAGNET SYSTEMS

[75] Inventor: Ian R. Young, West Overton, Nr. Marlborough, United Kingdom

[73] Assignee: Picker International, Ltd., Wembley, England

[21] Appl. No.: 254,076

[22] Filed: Oct. 3, 1988

[30] Foreign Application Priority Data

Oct. 5, 1987 [GB] United Kingdom ............... 8723307
Jan. 8, 1988 [GB] United Kingdom ............... 8800371

[51] Int. Cl.⁴ .......................................... G01R 33/20
[52] U.S. Cl. ................................... 324/318; 335/216
[58] Field of Search ............... 324/300, 318, 319, 320, 324/301, 309; 335/216, 297, 299, 304, 300; 128/653

[56] References Cited

U.S. PATENT DOCUMENTS 2,720,625  10/1955  Leete ................................... 324/300
3,379,979   4/1968  Aske ................................... 324/300

FOREIGN PATENT DOCUMENTS 1300259  6/1962  France ............................... 335/216
2136209  9/1984  United Kingdom .

Primary Examiner—Stewart J. Levy
Assistant Examiner—Kevin D. O'Shea
Attorney, Agent, or Firm—Timothy B. Gurin

[57] ABSTRACT

A magnet system (1) for a nuclear magnetic resonance (NMR) imaging apparatus comprising a magnetic core arrangement (7, 13, 15) shaped to provide two or more discrete gaps (3, 5) of different sizes in which objects to be imaged may be placed, the magnetic field across each gap being produced by a single drive coil arrangement (9) associated with the core arrangement. A system providing gaps of different sizes, for different types of NMR examination is thus provided at relatively low cost compared with using a separate magnet system for each type of examination.

13 Claims, 2 Drawing Sheets

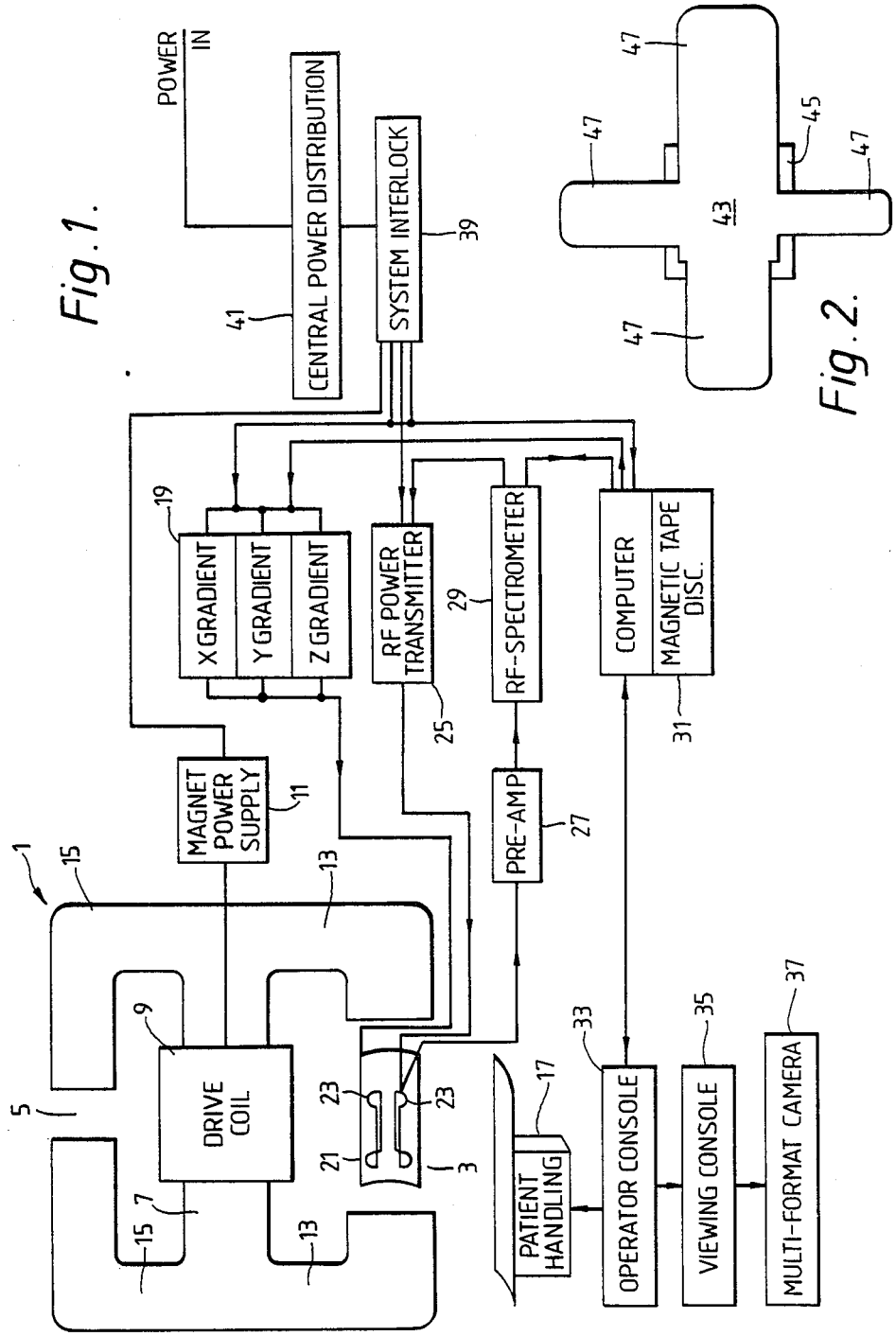

MAGNET SYSTEMS

This invention relates to magnet systems.

More particularly the invention relates to magnet systems suitable for use in nuclear magnetic resonance (NMR) imaging apparatus.

In such apparatus the object to be examined, e.g. imaged, is required to be positioned during examination in an extremely homogeneous static magnetic field of high strength which defines the equilibrium axis of magnetic alignment of the nuclei within the object.

For relatively low field systems it has been proposed to use an electromagnet comprising a core member of magnetic material, e.g. of 'C' shape, which carries a drive coil arrangement to produce a magnetic field between end portions of the core member positioned in facing relationship to define a gap in which an object to be examined is placed during examination.

Due to the requirements for high field homogeneity and good control of the field, the cost of such magnet systems tends to be high, especially when a drive coil of the super-conducting rather than the resistive type is used.

It is an object of the present invention to provide a magnet system suitable for use in NMR apparatus whereby this problem is alleviated.

According to the present invention a magnet system for use in an NMR imaging apparatus comprises a magnetic core arrangement which is shaped so as to provide a plurality of discrete gaps of different sizes each arranged to receive an object to be imaged and across each of which a magnetic field is produced on energisation of a single drive coil arrangement associated with the core arrangement.

In one particular system in accordance with the invention each said gap is defined between parts of a respective pair of limbs of the core arrangement which branch out from opposite ends of a central portion of the core arrangement embraced by said drive coil arrangement.

In one such system the limbs and central portion of the core arrangement comprise a single unitary member. In another such system the core arrangement comprises a plurality of C-shaped members whose central portions are positioned adjacent one another to form said central portion of the core arrangement.

In a magnet system according to the invention the core arrangement may suitably incorporate one or more members of a non-magnetic electrically conductive material shaped and positioned so as to attenuate changes in the magnetic field in the core arrangement due to imposition of a further magnetic field at a said gap by induction of eddy currents in said member or members.

One NMR imaging apparatus incorporating a magnet system in accordance with the invention will now be described, by way of example, with reference to the accompanying drawings in which:

FIG. 1 is a schematic diagram of the imaging apparatus;

FIG. 2 shows a diagrammatic plan view of an alternative form of the magnet system.

Figure 3:
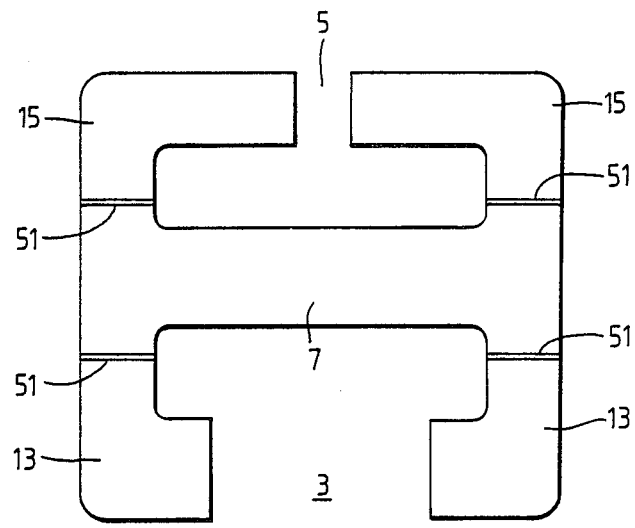
FIGS. 3 and 4 illustrate modifications of the magnet system of the imaging apparatus of FIG. 1.

The imaging apparatus is adapted for use in the examination of patients for medical purposes, and for the most part basically of conventional form as described for example in U.S. Pat. Specification Nos. 4,284,948 or 4,355,282.

Referring to FIG. 1, the imaging apparatus includes a magnet system 1 whereby a homogeneous static magnetic field is produced in each of two gaps 3 and 5. The magnet system comprises a magnetic core arrangement comprising a central portion 7 which carries a superconducting drive coil arrangement 9 arranged for energisation from a power supply 11. At each end of its central portion 7 the core arrangement branches into two limbs 13 and 15, extending in opposite directions, each pair of limbs 13 and 15 being shaped to define between facing end surfaces a respective one of the gaps 3 and 5.

The two gaps 3 and 5 are of different sizes so as to be adapted for use in different imaging operations. One gap 3 is relatively large so as to be suitable for imaging part, e.g. the torso, of a patient positioned on an associated patient handling device 17. The other gap 5 is smaller so as to be suitable for imaging a limb, e.g. the forearm, of a patient when placed in the gap by the patient.

Each of the gaps 3 and 5, when being used for imaging, is associated with three sets of magnetic field gradient coils of known form for imposing nominally linear magnetic field gradients on the static field in three orthogonal directions, under control of a gradient field controller 19. These gradient fields are used for selection of the region of an object under examination to be imaged, and spatial encoding of nuclear magnetic spins in known manner. In the drawing only one coil 21 in one of the gaps 3 is shown by way of example.

In addition, during imaging each gap 3 or 5 in use is associated with RF coils 23 of known form, shown only in gap 3 for simplicity, connected to a transmitter 25 to excite NMR in the object under examination, and to pick up the resultant signals in the object.

The signals picked up by coils 23 are amplified in a pre-amplifier 27 and analysed and processed in an RF spectrometer 29 and computer 31 under the control of an operator console 33, the console 33 being linked with an image viewing console 35 and a multi-format camera 37 unit for recording images. The overall operation of the imaging apparatus is controlled by the computer 31 in conjunction with a system interlock 39 via which electric power is passed from a central power distribution system 41 to the RF transmitter 25, gradient field controller 19 and main magnet supply 11, in dependence on instructions passed to the computer 31 from the operator console 33.

It will be appreciated that in other embodiments of the invention the magnet system may be arranged to provide more than two gaps in which an object may be placed for NMR imaging.

Referring to FIG. 2, in one such an alternative embodiment the magnet system comprises a core arrangement comprising a central portion 43 which carries a drive coil arrangement 45 and which branches at each end into four limbs 47 at right angles to one another so as to provide four gaps in which an object may be placed for examination.

It will be understood that a magnet system according to the invention has the advantage that at a small additional cost to the cost of a single magnet system providing a single gap in which objects can be placed for examination, there is provided an NMR apparatus capable of carrying out different types of examination which would otherwise require the provision of two or more complete magnet systems. It will be appreciated in this connection that the drive coil arrangement is in practice the most expensive part of a magnet system and that an increase of power to provide the required field in two or more gaps can be obtained with relatively small increase in cost.

Whilst in the embodiments of the invention described above the core arrangement comprises a single unitary member, it will be understood that in other embodiments of the invention the core arrangement may comprise an assembly of members. For example, the core arrangements of FIG. 1 and 2 may comprise an assembly of C-shaped members (two for FIG. 1, four for FIG. 2) whose central portions are positioned adjacent one another and embraced by the drive coil arrangement 9 or 45.

In an NMR apparatus incorporating a magnet system according to the invention, there is a possibility that a gradient magnetic field applied at one gap may effect the magnetic field at the other or other gaps. This effect is, of course, limited by the shunting action of the common central portion of the core arrangement, and would not arise if the gradient field were applied in a balanced manner to avoid any net change in the flux in the core arrangement. However, in practice some cross coupling between gaps on application of the gradient field is likely to exist.

To overcome this problem the core arrangement may incorporate one or more members of a non-magnetic material of good electrical conductivity such as aluminium or copper. The member or members are shaped and positioned so that changes of magnetic field in the core arrangement due to application of a gradient field at any gap are attenuated by induction of eddy currents in the member or members.

The members are best located away from the gaps and are of course required not to increase unduly the reluctance of the core arrangement.

The members may be in the form of thin sheets or plugs extending across the whole cross-sectional area of each gap-defining limb of the core arrangement. For example, in the ore arrangement shown in FIG. 1, a thin sheet or plug 51 of a suitable non-magnetic material may be provided in each of the limbs 13 and 15 adjacent the central portion 7 of the core arrangement, as shown in FIG. 3.

Figure 4:
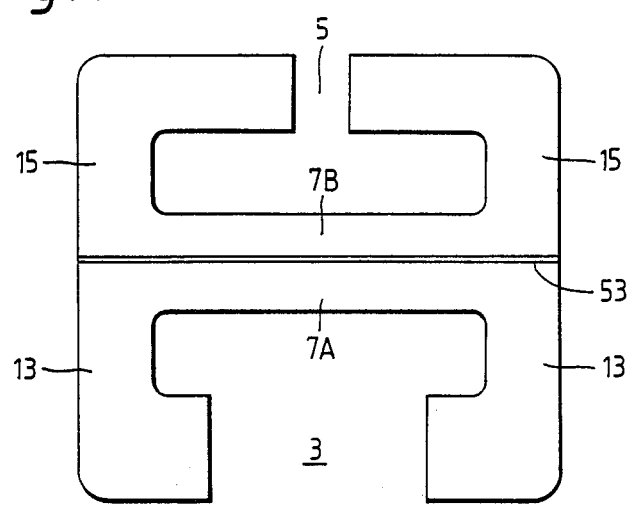

Alternatively, the member or members may be so arranged as to divide the portion of the core carrying the drive coil arrangement into segments each of which carries the flux directed across a respective gap only. For example, in the core arrangement shown in FIG. 1, a single thin sheet 53 of a suitable non-magnetic material may be provided which extends centrally along the length of the central portion 7 of the core arrangement so as to split the central portion into two segments 7A, 7B, one of which carries the flux directed across gap 3 only and the other of which carries the flux directed across gap 5, as shown in FIG. 4.

Where the core arrangement comprises an assembly of core members, e.g. C-shaped members, instead of a single unitary member, the non-magnetic member or members will, of course, merely fit between the respective core members, rather than divide the central portion of the core arrangement into segments.

I claim:

1. A magnet system for use in an NMR imaging apparatus comprising a magnetic core arrangement which is shaped so as to provide a plurality of discrete gaps of different sizes each arranged to receive an object to be imaged and a drive coil arrangement associated with the core arrangement so that on energisation of said drive coil arrangement a magnetic field is produced across each said gap.

2. A magnet system according to claim 1 wherein each said gap is defined between parts of a respective pair of limbs of the core arrangement, which limbs branch out from opposite ends of a central portion of the core arrangement, which central portion is embraced by said drive coil arrangement.

3. A magnet system according to claim 2 wherein said limbs and said central portion of the core arrangement a single unitary member.

4. A magnet system according to claim 2 wherein said core arrangement comprises a plurality of C-shaped members each having a central portion, said central portions being positioned adjacent one another to form said central portion of the core arrangement.

5. A magnet system according to claim 2 wherein said parts are facing end surfaces of said limbs.

6. A magnet system according to claim 1 wherein said core arrangement incorporates at least one member of a non-magnetic electrically conductive material shaped and positioned so that changes in a magnetic field in the core arrangement due to imposition of a further magnetic field at a said gap are attenuated by induction of eddy currents in said member.

7. A magnet system according to claim 6 where each said gap is defined between parts of a respective pair of limbs of the core arrangement, which limbs branch out from opposite ends of a central portion of the core arrangement, which central portion is embraced by said drive coil arrangement, and wherein each said at least one member of non-magnetic material is in the form of a thin sheet extending across the whole cross-sectional area of a said limb of the core arrangement.

8. A magnet system to claim 7 wherein each said at least one member of non-magnetic material is located in a said limb at a position nearer said central portion of the core arrangement than the gap defined by that limb.

9. A magnet system according to claim 6 wherein each said gap is defined between parts of a respective pair of limbs of the core arrangement, which limbs branch out from opposite ends of a central portion of the core arrangement, which central portion is embraced by said drive coil arrangement, and wherein said at least one member of non-magnetic material is so arranged as to divide the central portion of the core arrangement into segments each of which carries the flux directed across a respective said gap only.

10. A magnet system according to claim 1 wherein said drive coil arrangement is a super-conducting arrangement.

11. An NMR imaging apparatus incorporating a magnet system for applying a magnetic field to an object to be examined to establish an equilibrium axis of magnet alignment of nuclei within the object wherein said magnet system comprises a magnetic core arrangement which is shaped so as to provide a plurality of discrete gaps of different sizes each arranged to receive an object to be imaged and a drive coil arrangement associated with the core arrangement so that on energisation of said drive coil arrangement a magnetic field is produced across each said gap.

12. An NMR apparatus according to claim 11 wherein each said gap is defined between parts of a respective pair of limbs of the core arrangement, which limbs branch out from opposite ends of a central portion of the core arrangement, which central portion is embraced by said drive coil arrangement.

13. An NMR apparatus according to claim 12 wherein said core arrangement comprises at least one member of a non-magnetic electrically conductive material shaped and positioned so that changes in a magnetic field in the core arrangement due to imposition of a further magnetic field at a said gap are attenuated by induction of eddy currents in said member.

* * * * *